US009653903B2

(12) United States Patent
Jenny

(10) Patent No.: US 9,653,903 B2
(45) Date of Patent: May 16, 2017

(54) ELECTRICALLY CONDUCTIVE HOUSING WITH CABLE STRAIN RELIEF AND SHIELD CONNECTION

(71) Applicant: JENNY SCIENCE AG, Rain (CH)

(72) Inventor: Alois Jenny, Rain (CH)

(73) Assignee: JENNY SCIENCE AG, Rain (CH)

( * ) Notice: Subject to any disclaimer, the term of this patent is extended or adjusted under 35 U.S.C. 154(b) by 0 days.

(21) Appl. No.: 14/695,197

(22) Filed: Apr. 24, 2015

(65) Prior Publication Data

US 2015/0311690 A1 Oct. 29, 2015

(30) Foreign Application Priority Data

Apr. 25, 2014 (DE) .................. 10 2014 006 061

(51) Int. Cl.
*H02G 15/007* (2006.01)
*H05K 5/02* (2006.01)

(52) U.S. Cl.
CPC ......... *H02G 15/007* (2013.01); *H05K 5/0217* (2013.01); *H05K 5/0247* (2013.01)

(58) Field of Classification Search
CPC .................................................. H02G 15/007
See application file for complete search history.

(56) References Cited

U.S. PATENT DOCUMENTS

| 2009/0194644 A1* | 8/2009 | Lundborg | ................. F16L 5/08 248/49 |
| 2012/0018959 A1* | 1/2012 | Andersson | ................ F16L 5/08 277/607 |
| 2013/0056256 A1* | 3/2013 | Guillanton | ........... H01R 9/0503 174/359 |
| 2014/0069904 A1* | 3/2014 | Sammons | ............ H01R 13/502 219/136 |

FOREIGN PATENT DOCUMENTS

| CH | 201736 A | 12/1938 |
| DE | 2801483 A1 | 7/1979 |
| DE | 29701117 U1 | 3/1997 |
| DE | 19606050 A1 | 8/1997 |
| DE | 4293421 T1 | 1/2000 |
| DE | 20308288 U1 | 7/2003 |
| DE | 202011101380 | 9/2011 |

* cited by examiner

*Primary Examiner* — Hung V Ngo
(74) *Attorney, Agent, or Firm* — Browdy and Neimark, PLLC

(57) ABSTRACT

An electrically conductive housing with cable strain relief and shield connection, wherein a cable is introduced into a recess of the housing, wherein the strain relief includes a thrust member that can be displaced radially in the recess of the housing and the thrust member is biased with at least one housing-side clamping screw, presses the cable sheathing of the cable against a housing-side mold surface opposite the thrust member. The recess passes through the device wall of the housing in whose wall area the thrust member is arranged. The housing-side mold surface opposite the thrust member includes an mold surface conformed approximately to the outer shape of the cable sheathing that transitions into the recess in the device wall enlarged in comparison to the mold surface.

13 Claims, 8 Drawing Sheets

ELECTRICALLY CONDUCTIVE HOUSING WITH CABLE STRAIN RELIEF AND SHIELD CONNECTION

FIELD

The invention relates to an electrically conductive housing with cable strain relief and shield connection comprising a cable introduced into a recess of the housing.

BACKGROUND

An electrically conductive housing with cable strain relief and shield connection comprising a cable introduced into a recess of the housing is the subject of DE 28 01 483 C2. Strain relief with respect to the introduction of a cable into the handle of an electrical device, such as a soldering iron, is disclosed therein, the electrical device having a through-bore for the cable. The cable is enclosed by an anti-kink sleeve which prevents excessive buckling stress on the cable.

The known strain relief is formed by a clamping screw that acts as a thrust member and is arranged in a threaded hole of the handle. The thrust member has a stem-shaped projection which is expanded at its free end in a spherical manner and engaged in a central hole on the bolt side of the clamping screw. The site of engagement is located at the bolt-side end of the clamping screw.

While such a strain relief for an electrical cable has proven its worth, it has the drawback that the strain relief has a design that is elaborate and occupies a lot of space in terms of the axial length.

The clamping screw required for the compression of the thrust member is slotted at its bolt-side end in order to receive the associated spherical projection of the thrust member in a locking manner. In this way, the thrust member is to be attached to the clamping screw so as to be articulated but transfer pressure. This is therefore an elaborate construction that also has a large axial space requirement; after all, the thrust member is aligned with its longitudinal extension parallel to the longitudinal extension through the recess in the housing.

Another drawback of the known arrangement is that the cable protected by an anti-kink sleeve cannot lead out of the housing and a device wall at a tight bending radius, which prevents installation of such a housing in a tight installation space.

SUMMARY

It is therefore the object of the invention to develop an electrically conductive housing with cable strain relief and shield connection according to DE 28 01 483 C2 such that the strain relief arranged in the housing in the longitudinal direction of the cable occupies little installation space, so that the housing can be accommodated with the strain-relieved cable arranged therein even in tight installation spaces.

To achieve the stated object, an electrically conductive housing with a strain relief for a cable introduced into a recess of the housing is provided, wherein the strain relief consists of a thrust member that can be displaced radially in the recess of the housing, the thrust member being biased with at least one housing-side clamping screw, presses the cable sheathing of the cable against a housing-side mold surface opposite the thrust member. The recess passes through the device wall of the housing in whose wall area the thrust member is arranged, and the housing-side mold surface opposite the thrust member is a mold surface conformed approximately to the outer shape of the cable sheathing that transitions into the recess in the device wall enlarged in comparison to the mold surface. The mold surface can have an approximately semicircular or rectangular profile.

One essential feature of the invention is that the strain relief is now itself arranged in a recess of the device wall of the housing.

This constitutes a substantial difference from class-forming DE 28 01 483 C2, because the housing was arranged therein so as to be longitudinally extended in the manner of a stem or a sleeve in the housing, which is associated with a long installation length in the axial direction of the cable.

This is where the invention comes in, by providing only a recess in a relatively thin-walled or narrow device wall of the housing, the strain relief being arranged with the thrust member in the wall area of the recess, so that the thrust member does not project beyond the wall area of the device wall.

This results in a strain relief in the tightest of possible spaces, given that the strain relief is arranged solely and exclusively in the area of the recess of the device wall and extends—in one embodiment—neither inwardly into the housing nor outwardly beyond the housing dimensions.

It is especially advantageous if the housing-side mold surface opposite the thrust member into which the cable to be relieved is pressed is conformed approximately to the shape of the cable and preferably is formed as an approximately semicircular or rectangular surface into which the cable to be clamped is pressed, the shape depending on the shape of outer surface the cable.

This results in the advantage that the cable is pressed on the side opposite the thrust member not only flatly against a relatively flat housing wall—according to DE 28 01 483 C2—but rather that a mold surface is provided that is conformed approximately to the outer shape of the cable sheathing into which the cable to be relieved is pressed. According to the invention, if the cable has an outer shape that is circular, the mold surface is approximately semicircular. If the cable has an outer shape that is rectangular, the mold surface is rectangular to conform to the shape of the cable. This results in a large angle of contact over the periphery of the cable sheathing to be relieved and, accordingly, provides a favorable strain-relieving effect as well. In this way, the cable is not pressed flat in an undesirable manner but retains its profile shape. Consequently, the damaging of the cable strands arranged on the interior of the cable is prevented.

The other advantage is that the thrust member also forms an approximately semicircular or quarter-circular shield surface contact area, and this shield surface contact area arranged on the inside of the thrust member presses the cable to be relieved into the opposing semicircular mold surface in the area of the semicircular recess in the device wall, whereby a sealing effect and an increased clamping effect are produced on the cable to be relieved. Accordingly, by virtue of the shape of the thrust member, a pressing-flat of the cable is also prevented on this side.

The thrust member must therefore be pressed only with a relatively small amount of force by associated clamping screws against one side of the cable sheathing, so that the cable is pressed with this low pressing force with its opposing side into the approximately semicircular recess in the device wall and additionally compacted and compressed there.

A strong clamping effect can thus be produced for the cable with little actuating force in the smallest of spaces.

This renders strain relief sleeves and similar anti-kink devices superfluous, because it is now possible for the first time to arrange the strain relief in the relatively thin device wall and, after the strain relief of the cable, to lead it directly out of the device wall with a—possibly large—bending radius.

It is thus possible for the first time to produce an electrically conductive housing with a strain relief in which the strain-relieved cable can be led out of the device wall with an optionally large bending radius and in the smallest of spaces.

In one embodiment of the invention, a provision is made that the radial shifting of the thrust member occurs through two clamping screws arranged at a distance from one another which engage adjacent to and flush each other on the thrust member in the area of the longitudinal axis of the thrust member.

Through uniform tightening of the two clamping screws, the thrust member can thus be pressed uniformly against the previously introduced cable sheathing of the cable to be clamped, and the cable is then pressed uniformly into the approximately semicircular profile opening of the mold surface opposite the thrust member into the housing wall.

In one embodiment, the thrust member consists of an approximately C-shaped metal body consisting of a bottom wall on which projections are formed symmetrically on both sides, so that the thrust member forms an approximately C-shaped profile overall.

In one embodiment of the invention, a provision is made that pressure-increasing profiles are arranged in the area of the C-profile, i.e., in the area of the shield surface contact area of the thrust member.

In a first embodiment, a provision can be made that a continuous bar running parallel to the longitudinal axis of the thrust member is arranged in this area. Instead of a continuous bar, several ribs, profile nubs or tips can also be arranged.

The invention has proven to be of value especially in providing strain relief for shielded cables because, in providing strain relief for such cables, the cable sheathing is partially removed and the then-exposed braid is turned over around the cable sheathing, so that the braid rests against the outside of the cable sheathing, and the shielded cable prepared in this way is then plugged from the outside into the device wall, so that the exposed braid undergoes an electrical contact with the thrust member.

Reliable contacting of the braid with the thrust member and with the inner periphery of the opposing mold surface in the housing wall is achieved, because—as described above—the thrust member presses the cable to be relieved in the manner of a compression into the semicircular housing opening, whereby the cable becomes wedged in this semicircular housing opening, thus enabling optimal contacting of the strands of the shielding braid located therein with the electrical contact surfaces on the housing wall.

Besides the wedging or clamping effect of the cable in the semicircular recess in the device wall, superior contacting of the shielding braid with the associated electrically conductive housing walls is also achieved.

A provision is made in the development of the invention that friction- or contact-enhancing measures are additionally implemented in the area of these housing walls of the semicircular recess in the device wall as well. Such friction- or contact-enhancing measures are, in turn, bars, tips, profile nubs, or the like, for example.

In an exemplary embodiment of the invention, it is shown that the thrust member is displaced radially and uniformly against an opposing approximately semicircular housing opening in the device wall with the aid of two opposing clamping screws that engage in associated blind holes on the bottom surface of the thrust member.

This results in the described clamping and wedging effect of the cable sheathing pressed in there.

In another embodiment of the invention, a provision is made that the thrust member is pivot-mounted on one side, so that only a single clamping screw can be used. Instead of a clamping screw, a tension screw can also be used.

One end of the thrust member is supported, for example, in one side of the device wall so as to be swivelable about an axis, whereas the opposite side of the thrust member is pressed with a single clamping screw—pivoting about the swivel axis—against the cable sheathing.

In a third embodiment, instead of the described pivot mount on a support rod, a provision can also be made that the thrust member engages with an extended, offset end in a slot in the device wall and is received there in a swivelable and positionally secure manner. In this exemplary embodiment as well, only one single clamping screw is then used.

In a third embodiment, a provision can be made that the thrust member is embodied so as to be radially adjustable in relation to an opposing semicircular mold surface in the device wall using a center clamping screw.

Incidentally, the invention is not limited to having a thrust member that is unbending and inflexible.

In another embodiment of the invention, a provision can be made that the thrust member is made either of a bendable metal material or of a metallic plastic material embodied so as to be bendable.

The inventive subject matter of the present invention follows not only from the subject matter of the individual claims, but also from the combination of the individual claims with each other.

All information and features disclosed in the documents, including in the abstract, particularly the spatial embodiment depicted in the drawings, are claimed as being essential to the invention insofar as they are novel in view of the prior art individually or in combination.

BRIEF DESCRIPTION OF THE DRAWINGS

The invention is explained in further detail below with reference to drawings showing merely one possible embodiment. Additional inventive features and advantages that are essential to the invention follow from the drawings and the description thereof.

DETAILED DESCRIPTION

Figure 1:
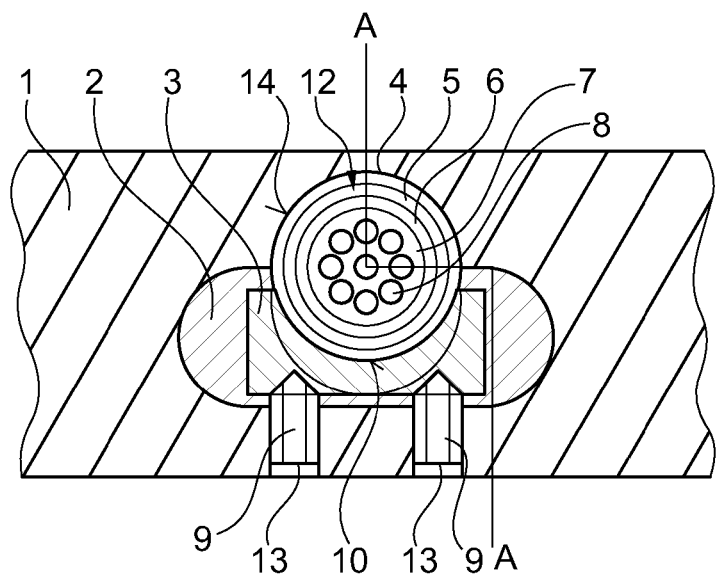
FIG. 1 shows a first embodiment as a section through the device wall of an electrically conductive housing with cable strain relief and shield connection in the assembled state.

FIG. 1 shows a schematic view of the device wall 1 of an electrically conductive housing (not shown in further detail) which preferably includes a closed housing body in whose device wall 1 a preferably shielded cable 12 is to be guided in a strain-relieved manner.

For this purpose, a recess 2 is disposed in the device wall 1 that passes through the device wall 1 and transitions in its upper area into an additional recess that is designated as the semicircular mold surface 14. According to one embodiment, the recess 2 has an approximately oval shape and the additional recess has an approximately semicircular shape. If the cable has an outer shape that is circular, the mold surface is approximately semicircular. If the cable has an outer shape that is rectangular, the mold surface is approximately rectangular to conform to the shape of the cable.

A thrust member 3 is inserted in the area of the approximately oval recess 2 that can be moved in the radial direction on its bottom side with the aid of two clamping screws 9 inserted in threaded holes 13, thus pressing the shielded cable 12 placed in the recess 2 and in the mold surface 14 against the upper side of the mold surface 14 having a round profile.

In the exemplary embodiment shown, the shielded cable 12 exists as a cable shield 4 placed over the outer sheathing 5 of the cable 12, thus forming the outer periphery of the cable 12 in the area of the strain relief and as cable strands arranged on the interior of the cable 12 that are enclosed radially on the outside by an electrically conductive cable shield 6.

Insulating layers 7 are arranged in a known manner between the cable strands 8.

At its inner periphery, the thrust member 3 forms a shield surface contact area 10 which, with conformed profile, rests pressingly at least in part against the outer periphery of the outer sheathing 5 as well as against the laid-over cable shield 4.

Figure 3:
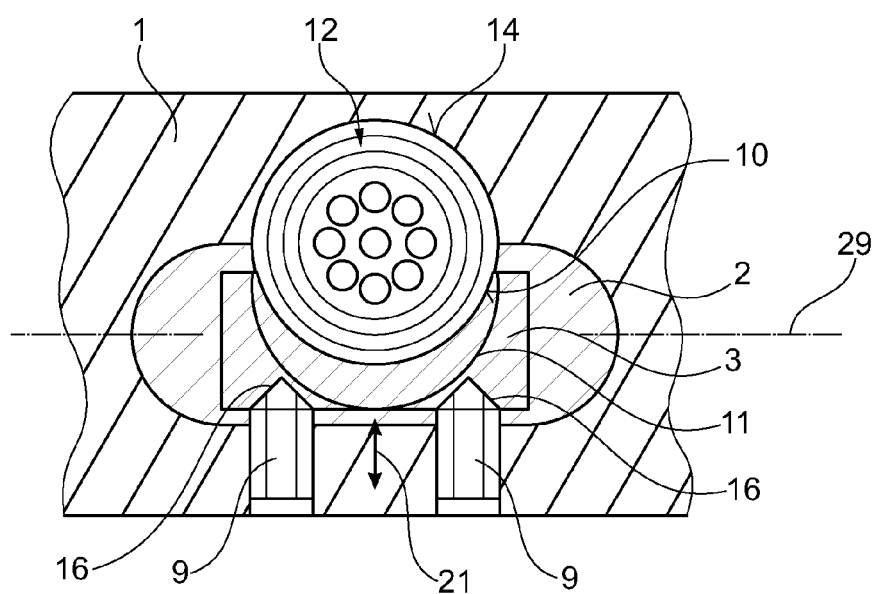
FIG. 3 shows an enlarged representation of the view according to FIG. 1 showing additional details.

According to FIG. 3, the thrust member 3 can thus be displaced and fixed in the arrow directions 21 radially in the recess 2 and thus also in the mold surface 14. The clamping screws 9 are preferably embodied as conically tapered set screws that engage with their tips in associated blind holes 16 of the bottom wall 27 (see FIGS. 9, 11, 4) of the thrust member 3.

Figure 4:
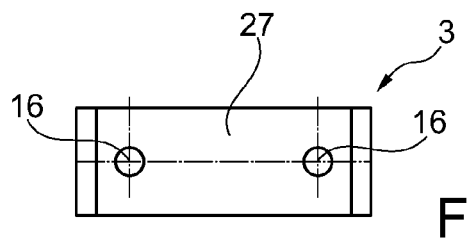
FIG. 4 shows a view of the bottom side of the thrust member according to FIGS. 1 to 3.
Figure 5:
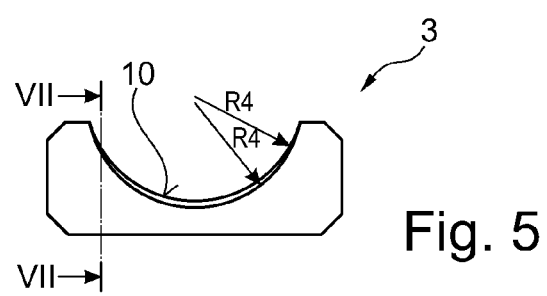
FIG. 5 shows a side view of the thrust member.
Figure 6:
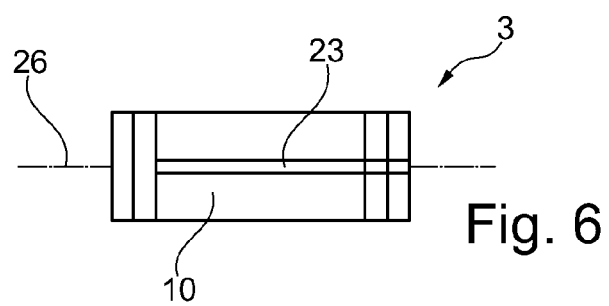
FIG. 6 shows a top view of the thrust member.
Figure 7:
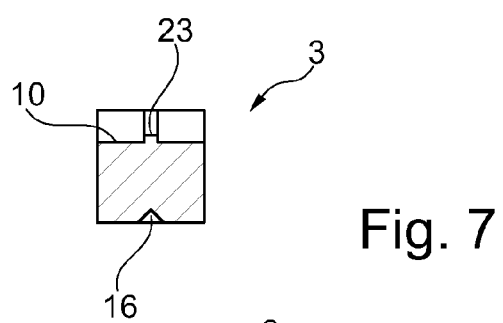
FIG. 7 shows a section through the thrust member according to line 7-7 in FIG. 5.
Figure 8:
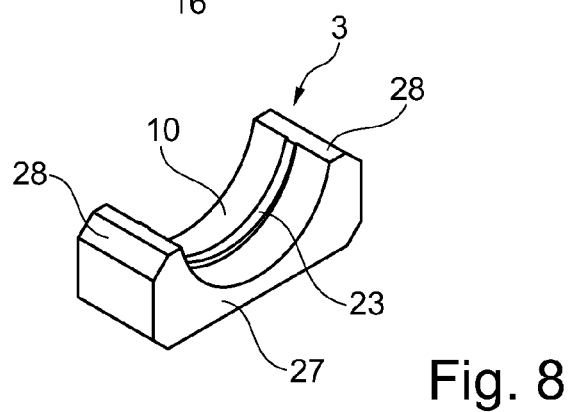
FIG. 8 shows a perspective view of the thrust member.

FIG. 4 shows the bottom wall 27 with the mutually parallel blind holes 16, whereas FIGS. 5 and 6 show a side view and a top view of the thrust member 3. It can be seen that the front face contact area 10 of the recess 2 has an approximately semicircular profile according to one embodiment. Further, a raised rib 23 is provided in the area of the front face contact area 10, which raised rib 23 runs parallel to the longitudinal axis 26 of the thrust member 3 and strides across the entire shield surface contact area 10.

Instead of such a rib 23, several adjacent ribs can also be provided. The ribs 23 can also be interrupted or replaced by nubs or by other friction-enhancing means.

Figure 9:
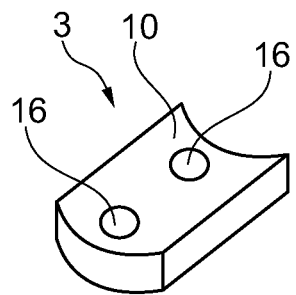
FIG. 9 shows a schematized representation of a thrust member in a second embodiment.
Figure 10:
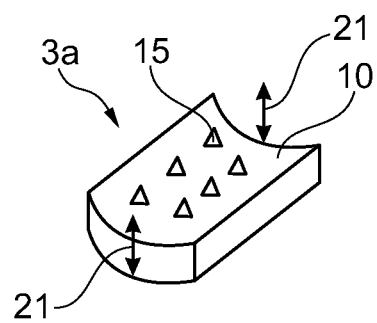
FIG. 10 shows a schematized representation of the thrust member in a third embodiment.

For instance, FIG. 9 shows that the shield surface contact area 10 can also be completely smooth, and FIG. 10 shows that the shield surface contact area can also be provided with friction-enhancing tips 15 or the like.

Figure 11:
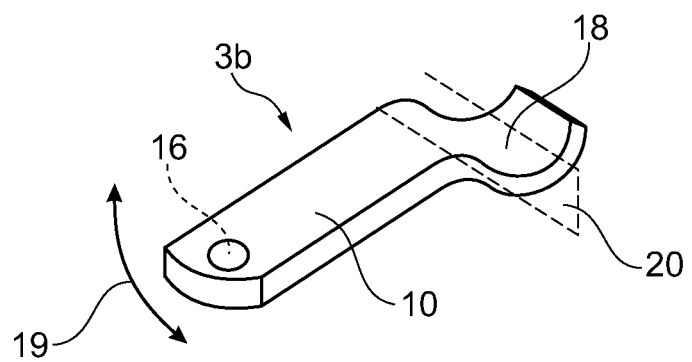
FIG. 11 shows a schematized representation of a thrust member in a fourth embodiment.

As an additional exemplary embodiment, FIG. 11 shows that the thrust member 3 can also be pivot-mounted on one side by inserting it with an offset bending end 18 into a slot 20 in the recess 2 of the device wall 1 and held there so as to be swivelable in the arrow directions 19.

If a single clamping screw engages on the blind hole 16, the free, swivelable end of the thrust member 3b is thus pressed upward in arrow direction 19, thus pressing the cable sheathing of the cable 12 into the mold surface 14.

In contrast, FIG. 10 shows that, instead of a swiveling motion in arrow direction 19, a simultaneously radial sliding movement in arrow directions 21 can also be provided for the thrust member 3a or the thrust member 3 according to FIG. 3.

Figure 12:
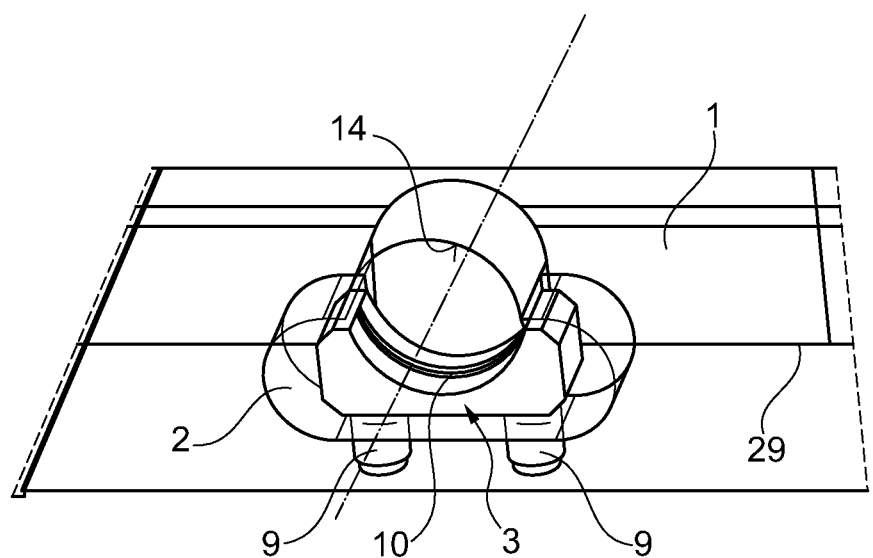
FIG. 12 shows a perspective view of a device wall in an electrically conductive housing with inserted thrust member before assembly of a cable provided with a shielding braid.
Figure 13:
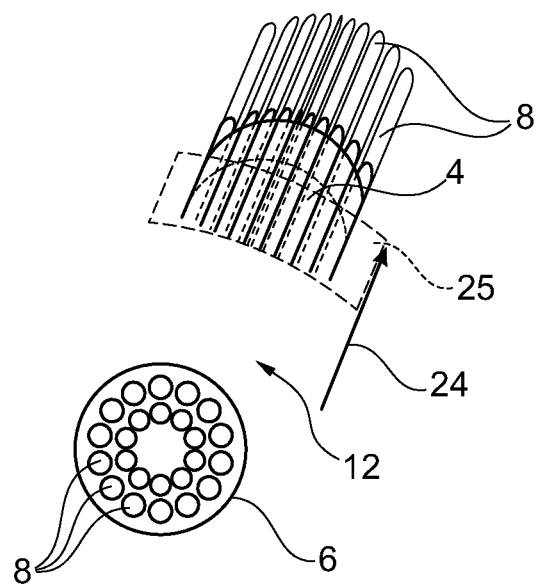
FIG. 13 shows the cable provided for strain relief.

FIGS. 12 and 13 now show the strain relief according to the invention in the assembled state.

FIG. 12 shows a perspective view of the strain relief in the device wall 1 according to the representation in FIG. 1, and it can be seen that the shielded cable 12 shown in FIG. 13 is now released from its outer sheathing 5, and the cable shield 6 located thereunder is now folded back as a laid-over cable shield 4.

This results in a pressing surface 25 for pressing the shield surface contact area 10 of the thrust member 3, 3a, 3b in the area of the pressing surface 25 onto the laid-over cable shield 4.

In the assembled position shown according to FIG. 13, the cable 12 is now plugged into the strain relief prepared according to FIG. 12, particularly such that the thrust member 3 rests with its shield surface contact area 10 on the underside of the pressing surface 25 of the cable 12 and, simultaneously, the upper side of the cable 12 comes to rest against the inner periphery of the mold surface 14.

This result in comprehensive contacting on all sides of the laid-over cable shield 4 in the area of the strain relief, which leads an operationally reliable contacting of the cable shield 4 that is superior compared to the prior art.

As will readily be understood, the invention is not limited to a strain relief for shielded cables 12.

Other cables can also be strain-relieved that do not have cable shields 4, 6. It is also possible to use fiber optic cables and unshielded single- or multi-core cables and strands.

In this case, a provision can be made that the thrust member 3, 3a, 3b is made of a flexible, insulating plastic material, and the clamping screws 9 can also be made of a plastic material.

Figure 14:
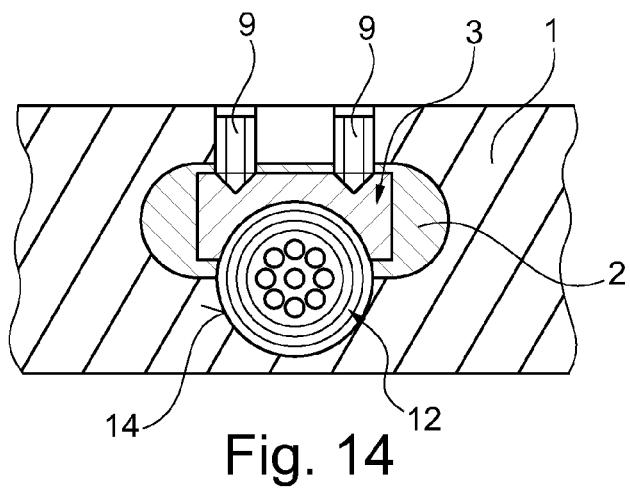
FIG. 14 shows an embodiment of a strain relief that has been modified compared to FIG. 1.
Figure 15:
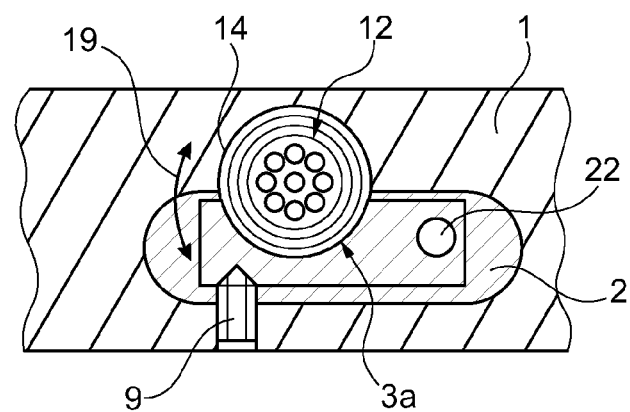
FIG. 15 shows an embodiment that is different from FIG. 14.
Figure 16:
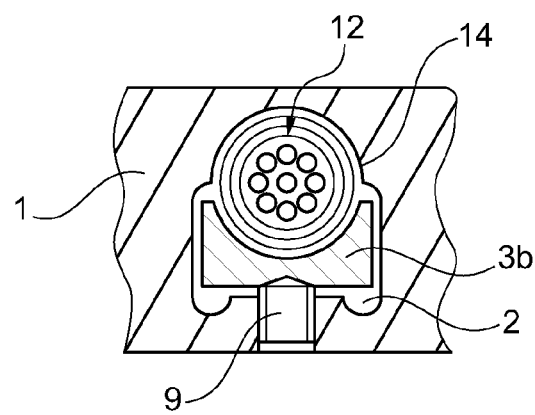
FIG. 16 shows a third embodiment in comparison to FIGS. 14 and 15.

FIGS. 14 to 16 show various developments of the inventive idea according to the above drawings.

FIG. 14 shows that the strain relief illustrated in FIG. 1 can also be arranged overhead.

FIG. 15 shows the support of the thrust member that is swivelable on one side with a pivot-mount 22 about which the thrust member 3 can be swiveled in the arrow directions 19, it then only being necessary to use a single clamping screw 9.

In contrast, FIG. 16 shows that the thrust member can also be biased as a symmetrical part only by a single clamping screw 9 in order to press the cable to be clamped 12 into the mold surface 14 conformed to the cable sheathing in the area of the upper recess and wedge it therein.

According to FIGS. 4 to 8, however, it is preferred if the thrust member 3 consists of a metal part, preferably a light metal alloy and the two mutually symmetrical projections 28 are molded onto the bottom wall 27, thus resulting in a profile part that is approximately C-shaped overall as a thrust member 3.

It is important that the longitudinal axis 26 of the thrust member 3 extend parallel to the transverse axis 29 (see FIG. 3) of the recess 2, so that the thrust member is seated flush in the recess 2 of the device wall 1 or is even narrower than the thickness of the device wall 1 in order to prevent the thrust member from protruding out of the device wall 1 to the front or back. This enables reliable strain relief of a cable 12 in the smallest of spaces—corresponding to the thickness of the device wall 1—which cable 12 can be pressed with a thrust member that can be actuated with little force into a mold surface 14 enclosing a circumferential angle of less than 180 degrees and wedged therein.

FIG. 14 shows an overhead assembly of a strain relief according to the invention. In this illustration, it becomes clear that the thrust member 3 can be arranged not only in a standing manner like in FIGS. 1 to 13 but also in a hanging manner. To facilitate assembly, a provision can be made here that the tips of the clamping screws 9 that engage in the thrust member 9 are rotatably coupled with the thrust member. This can be done, for example, such that Seeger rings (not shown in further detail) are arranged on the tips that engage in a respective recess (not shown in further detail) on the thrust member in order to thus enable a rotatable, load-transmitting connection between the clamping screws 9 and the thrust member 3 coupled therewith. The thrust member 3 thus hangs on the clamping screws 9. In another embodiment of FIG. 14, however, the load-transmitting connection on the hanging thrust member 3 in the direction of the clamping screws 9 can be omitted. The thrust member 3 is then embodied so as to be separate from the clamping screws.

According to the exemplary embodiment of FIG. 15, a provision can be made that the thrust member 3 is pivot-mounted in the area of a one-sided pivot-mount 22 in the recess 2 on the device wall 1 and only the swivelable free end of the thrust member 3 is biased with a clamping screw 9. In this way, the thrust member 3 can be swiveled in the arrow directions 19 in the direction of the opposing mold surface 14 in the device wall 1 in order to clamp and release the cable.

According to the exemplary embodiment according to FIG. 16, only one thrust member 3b is provided which encloses the clamping cable 12 with a circumferential angle of greater than 180°.

Figure 17:
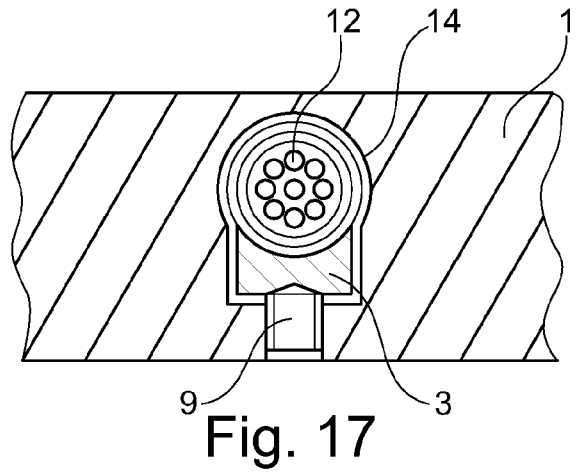
FIG. 17 shows a fourth embodiment with a thrust member and a single clamping screw.

FIG. 17 shows an embodiment that has been modified in comparison to FIG. 16, in which the thrust member 3 encloses the cable 12 with a circumferential angle of less than 180°.

Figure 18:
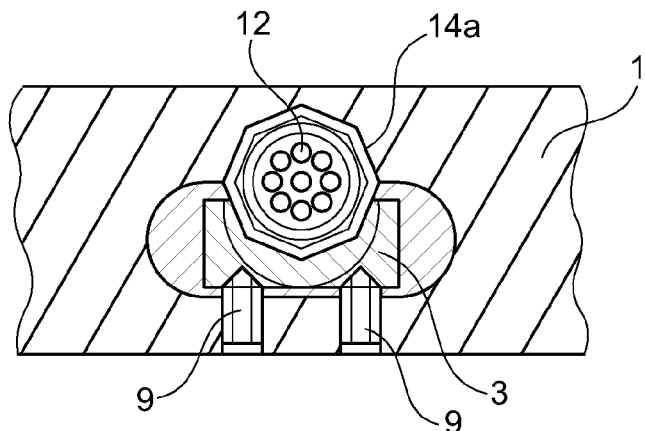
FIG. 18 shows a fifth embodiment with a polygonal mold surface in the device wall for receiving a cable with a round profile in a clamping manner.

It is shown in FIG. 18 that, according to another embodiment of the invention, a cable 12 with a round profile can also be clamped in a mold surface 14a having a polygonal profile.

The embodiment of a mold surface 14a with a polygonal profile offers the advantage that the clamped cable 12 with a round profile is protected even better against unintentional twisting in the mold surface 14a. The cable 12 is plastically modelled, so to speak, in the mold surface 14a with a polygonal profile and conformed to the polygonal edges of the mold surface 14a and then pressed in a positive and nonpositive manner.

Figure 2:
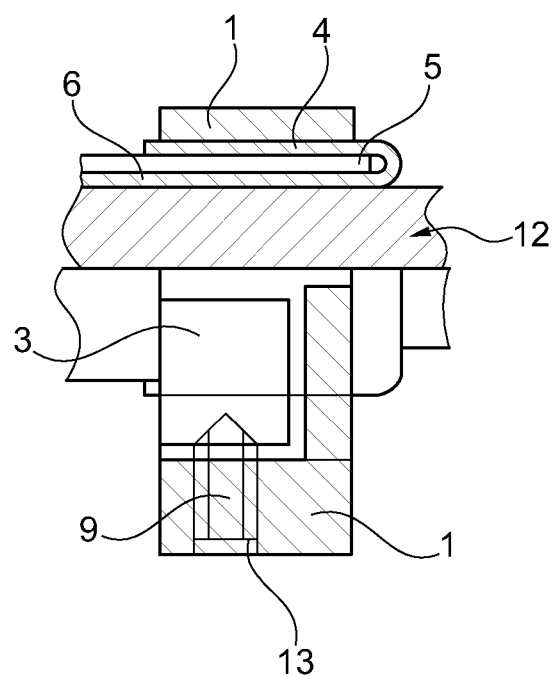
FIG. 2 shows the section according to line A-A in FIG. 1.
Figures 19, 20:
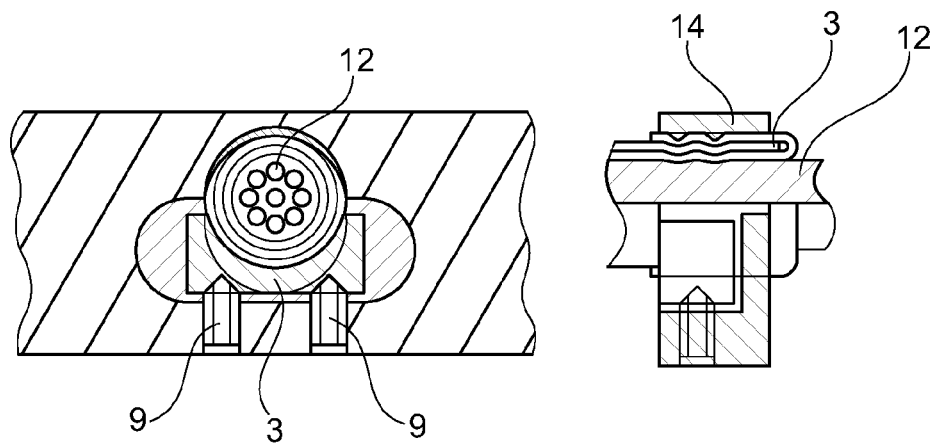
FIGS. 19 and 20 show a similar representation as in FIGS. 1 and 2.

FIGS. 19 and 20 show an illustration similar to FIGS. 1 and 2, for which reason the description thereof is also applicable to this exemplary embodiment.

As will readily be understood, as regards the illustration in FIG. 18, it is possible in another embodiment (not shown) to adapt the profiling of the mold surface 14, 14a to the profiling of the cable 12, which means that the profiling of the cable 12 matches with the profiling of the mold surface 14. A cable 12 with a round profile is then received in a mold surface 14 with a round profile, whereas a polygonal profile of a cable 12a is received in a commensurately profiled mold surface 14a.

Figure 21:
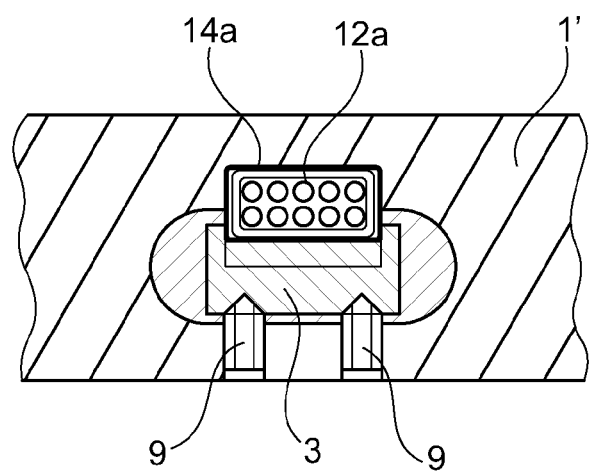
FIG. 21 shows a sixth embodiment of a strain relief for clamping a cable with a rectangular profile.

Such an example is shown in FIG. 21. It is shown there that, instead of a cable 12 with a round profile, a cable 12a with a rectangular profile can also be clamped which is embodied as a fiber optic cable in the depicted exemplary embodiment. The rectangular profile is merely shown as representative of a great number of possible profile shapes of cables to be clamped.

The invention is therefore not limited to the strain relief of cables having a round profile but includes strain relief for cables having any profile, it following from FIGS. 18 and 21 that the adapting surface (pressing surface) of the thrust member 3, 3a abutting against the cable 12, 12a is conformed to the profile of the cable and corresponds thereto.

In relation to FIG. 18, however, a provision can also be made that, in order to clamp a cable 12 with a round profile, the mold surface 14a in the device wall 1 has a profile that deviates from the periphery of the cable (e.g., a polygonal profile), whereas the pressing surface of the thrust member abutting in a load-transmitting manner against the opposing side on the outer sheathing of the cable 12 can have a round profile.

LEGEND OF SYMBOLS IN DRAWINGS 1 device wall
2 recess
3 thrust member 3a, 3b
4 cable shield (outside)
5 outer sheathing
6 cable shield
7 insulating layers
8 cable strands
9 clamping screw
10 shield surface contact area
11 through-hole
12 shielded cable
12a rectangular cable
13 threaded hole
14 mold surface (in 2)
14a mold surface (in 2)
15 tips
16 blind hole
17

18 bending end
19 arrow direction
20 slot (in 1)
21 arrow direction
22 pivot-mount
23 rib
24 arrow direction
25 pressing surface/on
26 longitudinal axis (of 3)
27 bottom wall (of 3)
28 projection (of 3)
29 transverse axis (of 2)

The invention claimed is:

1. An electrically conductive housing with a strain relief for a cable introduced into a recess of the housing, the cable having a cable sheathing, wherein the strain relief comprises a thrust member that can be displaced radially in the recess of the housing, the thrust member being biased with at least one housing-side clamping screw that engages in a mating threaded hole in the housing, presses the cable sheathing of the cable against a housing-side mold surface opposite the thrust member, wherein the housing comprises a device wall through which the recess and the threaded hole pass and in which the mold surface is provided, and the strain relief is arranged, solely and exclusively in the area of the recess of the device wall and in which the thrust member is arranged, and the housing-side mold surface opposite the thrust member comprises a mold surface conformed approximately to the outer shape of the cable sheathing that transitions into the recess in the device wall enlarged in comparison to the mold surface.

2. The electrically conductive housing as set forth in claim 1, further comprising two clamping screws arranged at a distance from one another that engage on the thrust member in order to radially displace the thrust member.

3. The electrically conductive housing as set forth in claim 2, wherein the two clamping screws engage in associated blind holes on a bottom surface of the thrust member in a manner to cause the thrust member to be displaced uniformly against an opposing approximately semicircular housing opening in the device wall.

4. The electrically conductive housing as set forth in claim 1, wherein the thrust member comprises an approximately C-shaped metal body whose surface aligned against the cable sheathing is embodied as a shield contact area for contacting a metallic braid of a cable shield.

5. The electrically conductive housing as set forth in claim 4, further comprising at least one rib resting against the outer periphery of the cable sheathing is arranged in the area of the shield contact area in the thrust member.

6. The electrically conductive housing as set forth in claim 4, further comprising tips aligned against the cable sheathing are arranged in the area of the shield contact area.

7. The electrically conductive housing as set forth in claim 1, wherein the thrust member is supported in the recess of the device wall so as to be swivelable on one side, and further comprising only one clamping screw that engages on the free, swivelable part of the thrust member.

8. The electrically conductive housing as set forth in claim 1, wherein the thrust member (3a) is supported in a slot in the device wall so as to be swivelable on one side, and further comprising only one clamping screw that engages on the free, swivelable part of the thrust member.

9. The electrically conductive housing as set forth in claim 1, wherein a longitudinal axis of the thrust member extends parallel to a transverse axis of the recess in the device wall.

10. The electrically conductive housing as set forth in claim 1, wherein a profile of the approximately semicircular mold surface is less than 180 degrees.

11. The electrically conductive housing as set forth in claim 1, wherein the thrust member and the mold surface are electrically conductive, and a braiding of the cable shield laid outwardly over the outer sheathing is pressed in an electrically conductive manner by the thrust member against the mold surface in the device wall.

12. The electrically conductive housing as set forth in claim 1, wherein the mold surface has an approximately semicircular profile.

13. The electrically conductive housing as set forth in claim 1, wherein the mold surface has an approximately rectangular profile.

* * * * *